United States Patent [19]
Seo et al.

[11] Patent Number: 5,856,748
[45] Date of Patent: Jan. 5, 1999

[54] SENSING AMPLIFIER WITH CURRENT MIRROR

[75] Inventors: Yong-Seok Seo, Seoul; Heung-Soo Im, Suwon, both of Rep. of Korea

[73] Assignee: Samsung Electronics, Co., Ltd., Suwon, Rep. of Korea

[21] Appl. No.: 845,270

[22] Filed: Apr. 24, 1997

[30] Foreign Application Priority Data

Apr. 24, 1996 [KR] Rep. of Korea .................. 1996 12701

[51] Int. Cl.$^6$ .................................................. G11C 7/06
[52] U.S. Cl. .................. 327/53; 327/52; 327/56
[58] Field of Search .................................. 327/51, 52, 53, 327/54, 55, 56

[56] References Cited

U.S. PATENT DOCUMENTS

| | | | |
|---|---|---|---|
| 4,670,675 | 6/1987 | Donoghue ................................. | 327/52 |
| 4,802,138 | 1/1989 | Shimamune ............................... | 327/52 |
| 5,638,322 | 6/1997 | Lacey .................................. | 365/185.21 |

OTHER PUBLICATIONS

Kenichi Imamiya et al. "A 68–ns 4–Mbit CMOS EPROM with High–Noise–Immunity Design" Feb. 1990, IEEE Journal of Solid–State Circuits, vol. 25, No. 1 pp. 72–78.

*Primary Examiner*—Toan Tran
*Attorney, Agent, or Firm*—Marger, Johnson & McCollom, P.C.

[57] ABSTRACT

A sense amplifier increases the differential voltage between a reference signal and a sense signal by using a current mirror to control the generation of the reference signal and the sense signal responsive to a common control signal. The sense amplifier includes a reference signal generator for generating the reference signal at a reference node responsive to a reference cell, a sense signal generator for generating the sense signal at a sense node responsive to the state of a memory cell, and a differential amplifier for amplifying the voltage difference between the reference signal and the sense signal. The reference node is coupled to the reference cell which discharges current from the reference node, and the sense node is coupled to the memory cell which discharges current from the sense node. The reference signal generator includes a first current source transistor that is coupled between a power supply terminal and the reference node. The sense signal generator includes a second current source transistor coupled between the power supply terminal and the sense node. The control terminals of the first and second transistors are coupled together to receive the common control signal from either the reference node or the sense node. In either configuration, the control terminal of one of the current source transistor is decoupled from its respective node to allow the voltage of the node to vary widely with respect to the other node.

23 Claims, 5 Drawing Sheets

SENSING AMPLIFIER WITH CURRENT MIRROR

This application corresponds to Korean Patent Application No. 12701/1996, filed Apr. 24, 1996 in the name of Samsung Electronics Co., Ltd., which is herein incorporated by reference for all purposes.

BACKGROUND OF THE INVENTION

1. Field of the Invention

This invention relates generally to sense amplifiers for semiconductor memory devices, and more particularly to a sense amplifier that employs a current mirror to increase the voltage differential between a reference signal and a sense signal.

2. Description of the Related Art

To increase the integration level of semiconductor memory devices, the size of individual memory cells must be decreased. Such a reduction in memory cell size inevitably results in a reduction in memory cell current. For semiconductor memory devices intended for use in portable electronic equipment which operates at low voltages, the memory cell current required for sensing data is reduced even further because the devices operate at very low voltages.

However, when the current through a semiconductor memory cell is decreased, the speed of a sense amplifier which is used to sense the state of the memory cell decreases in proportion to the decrease in the memory cell current. As a result, the operating speed of the semiconductor memory device is reduced.

A sense amplifier senses and amplifies the voltage difference between an input sense signal, which has a voltage that is determined by the cell current flowing through a memory cell, and a reference signal, which has a voltage that is determined by a reference current which is typically generated by a reference cell.

The speed of a sense amplifier can be increased by increasing the voltage difference between the sense signal and the reference signal. In the case of existing semiconductor memory devices, however, the difference between the sense voltage and the reference voltage is typically small because the devices are operated at low voltages. Many efforts have been made to increase the voltage difference between the sense voltage and reference voltage so as to increase the operating speed of the memory device.

FIG. 1 is a schematic diagram of a prior art sense amplifier. The sense amplifier of FIG. 1 includes a sense voltage signal generator 200 for generating a sense voltage signal at sense node N20 in response to the state of a memory cell. A reference signal generator 100 generates a reference voltage signal at reference node N2. The sensing amplifier also includes a differential amplifier 300 for amplifying the voltage difference between the sense signal and the reference signal.

The reference signal generator 100 includes an inverter comprised of PMOS transistor 101 and NMOS transistor 102 for inverting a control signal/SA. An NMOS transistor 106 has a channel connected in series between a node N1 and power supply ground terminal. The NMOS transistor 106 also has a gate connected to a node N3. The reference signal generator 100 further includes another NMOS transistor 103 having a channel coupled between a power supply terminal and a node N2, and a gate the controls the transistor in response to a pre-charge signal ØPRE. A PMOS transistor 104 has a channel connected in series between the power supply terminal and node N2. The PMOS transistor 104 also has a gate connected to node N2. Another NMOS transistor 105 has a channel connected in series between the nodes N2 and N3. The NMOS transistor 105 has a gate to which the voltage at the node N1 is applied. The inverter includes a PMOS transistor 101 and an NMOS transistor 102 having channels connected in series between the power supply terminal and the power supply ground terminal. The PMOS transistor 101 and NMOS transistor 102 receive the sense amplifier control signal/AS at their common gate and are driven in response to the control signal.

The sense voltage signal generator 200 has the same configuration as the reference voltage signal generator 100. Specifically, the sensing voltage signal generator 200 includes PMOS transistors 201 and 204 which correspond PMOS transistors 101 and 104, respectively, and NMOS transistors 202, 203, 205 and 206 which correspond to NMOS transistors 102, 103, 105 and 106, respectively, and nodes N10, N20 and N30 which corresponds nodes N1, N2 and N3, respectively.

In operation, when the sense amplifier control signal/SA is switched from the high logic level to the low logic level, PMOS transistor 101 is activated and NMOS transistor 102 is deactivated. This causes the voltage at node N1 to increase to high level. The precharge control signal ØPRE is switched from low to high simultaneously with the high to low transition of the sense amplifier control signal/SA. This activates NMOS transistor 103, thereby causing the voltage at node N2 to rise.

When the voltages at nodes N1 and N2 increase, current flows from node N2 to N3 by virtue of the activation of NMOS transistor 105. As a result, capacitor C1 is charged, thereby causing the voltage at node N3 to rise. This in turn causes the voltage at the gate of NMOS transistor 106 to rise. The voltage at node N1 is then fixed at a level at which the current supply capability of PMOS transistor 101 is balanced with the current discharge capability of NMOS transistor 106.

After the voltage at node N1 is stabilized at a fixed level, the precharge control signal ØPRE is deactivated, i.e., switched from high to low, and NMOS transistor 103 stops supply current to node N2. Under this condition, current supply transistor 104 is the only transistor that supplies current to node N2. Since current is discharged from node N2 by a reference current supply source 107 in this state, the voltage at node N2 is determined by the difference between the amount of current supplied by PMOS transistor 104 and the amount of current discharged by the reference current supply 107. This voltage is applied to one input terminal of the differential amplifier 300 as a reference voltage signal. Thus, the reference signal is generated at node N2 by the current source 104 in response to the current demanded by reference current supply source 107.

Since the sense voltage signal generating unit 200 has essentially the same configuration as the reference voltage signal generator 100, the operation is essentially the same except that, when the signal ØPRE is activated, the voltage at sense node N20 is determined by the difference between the amount of current supplied by PMOS current supply transistor 204 and the amount of current discharged by the memory cell current supply source 207. This voltage is applied to the other input terminal of the differential amplifier 300 as the sense voltage signal.

The reference current supplied by the reference cell current supply source 107 is fixed at about one half of the current flowing through a cell which is in the ON state. Accordingly, the voltage of the reference signal at node N2 is maintained at a voltage midway between the voltage generated by reading a cell in the ON state and a cell in the OFF state.

The operation of the sense amplifier of FIG. 1 will now be described in more detail with reference to FIG. 2 which shows variations in the voltages at the references node N2 and the sense node N20. The PMOS current supply transistor 104 of reference signal generator 100 is diode connected in a feedback configuration in which its gate is connected to its drain at node N2. In this configuration it serves as a current supply source for current which is discharged from node N2 by the reference cell current supply source 107. Similarly, PMOS current supply transistor 204 of the sense signal generator 200 is diode connected in a feedback configuration in which its gate is connected to its drain at the sense node N20 from which the memory cell current supply source 207 discharges current.

When the current supply transistors 102 and 104 are diode connected in feedback configurations, the sense amplifier operates as follows during a read operation.

When the memory cell is in an OFF state, PMOS transistor 204 continuously supplies current to the sense node N20. This causes the voltage at node N20 to increase rapidly because the memory cell current source 207 does not discharge any current from node N20 when it is in the OFF state. However, when the voltage at node N20 rises to a certain level, PMOS transistor 204 switches off due to the voltage on its gate. Thus, the voltage at node N20 is limited before a sense operation begins. On the other hand, when the memory cell is in the ON state, the voltage at node N20 decreases rapidly. However, when the voltage at node N20 decreases to a certain level, PMOS transistor 204 switches on, thereby limiting the level to which the voltage at node N20 can drop.

Thus, when the current source transistors 104 and 204 in the reference signal generator and sense signal generator are diode connected in a feedback configuration, the differential voltage between the reference node N2 and the sense node N20 is limited by the feedback operation of transistors 104 and 204. However, the differential voltage between the reference node N2 and sense node N20 must be increased to increase the sensing speed and sensitivity of differential amplifier 300. Thus, the feedback connected transistors 102 and 104 limit the speed and sensitivity of the sense amplifier.

SUMMARY OF THE INVENTION

It is therefore an object of the present invention to improve the sensing speed and sensitivity of a sense amplifier.

Another object of the present invention is to increase the voltage difference between a reference signal and a sense signal in a sense amplifier.

To accomplish these and other objects, the Applicants have invented a sense amplifier which increases the differential voltage between a reference signal and a sense signal by using a current mirror to control the generation of the reference and sense signals responsive to a common control signal. The sense amplifier includes a reference signal generator for generating the reference signal at a reference node responsive to a reference cell, a sense signal generator for generating the sense signal at a sense node responsive to the state of a memory cell, and a differential amplifier for amplifying the voltage difference between the reference signal and the sense signal. The reference node is coupled to the reference cell which discharges current from the reference node, and the sense node is coupled to the memory cell which discharges current from the sense node. The reference signal generator includes a first current source transistor that is coupled between a power supply terminal and the reference node. The sense signal generator includes a second current source transistor coupled between the power supply terminal and the sense node. The control terminals of the first and second transistors are coupled together in a current mirror configuration to receive the common control signal from either the reference node or the sense node. In either configuration, the control terminal of one of the current source transistor is decoupled from its respective node to allow the voltage of the node to vary widely with respect to the other node.

The foregoing and other objects, features, and other advantages of the invention will become more readily apparent from the following detailed description of a preferred embodiment of the invention which proceeds with reference to the accompanying drawings.

DETAILED DESCRIPTION OF THE PREFERRED EMBODIMENTS

Figure 3:
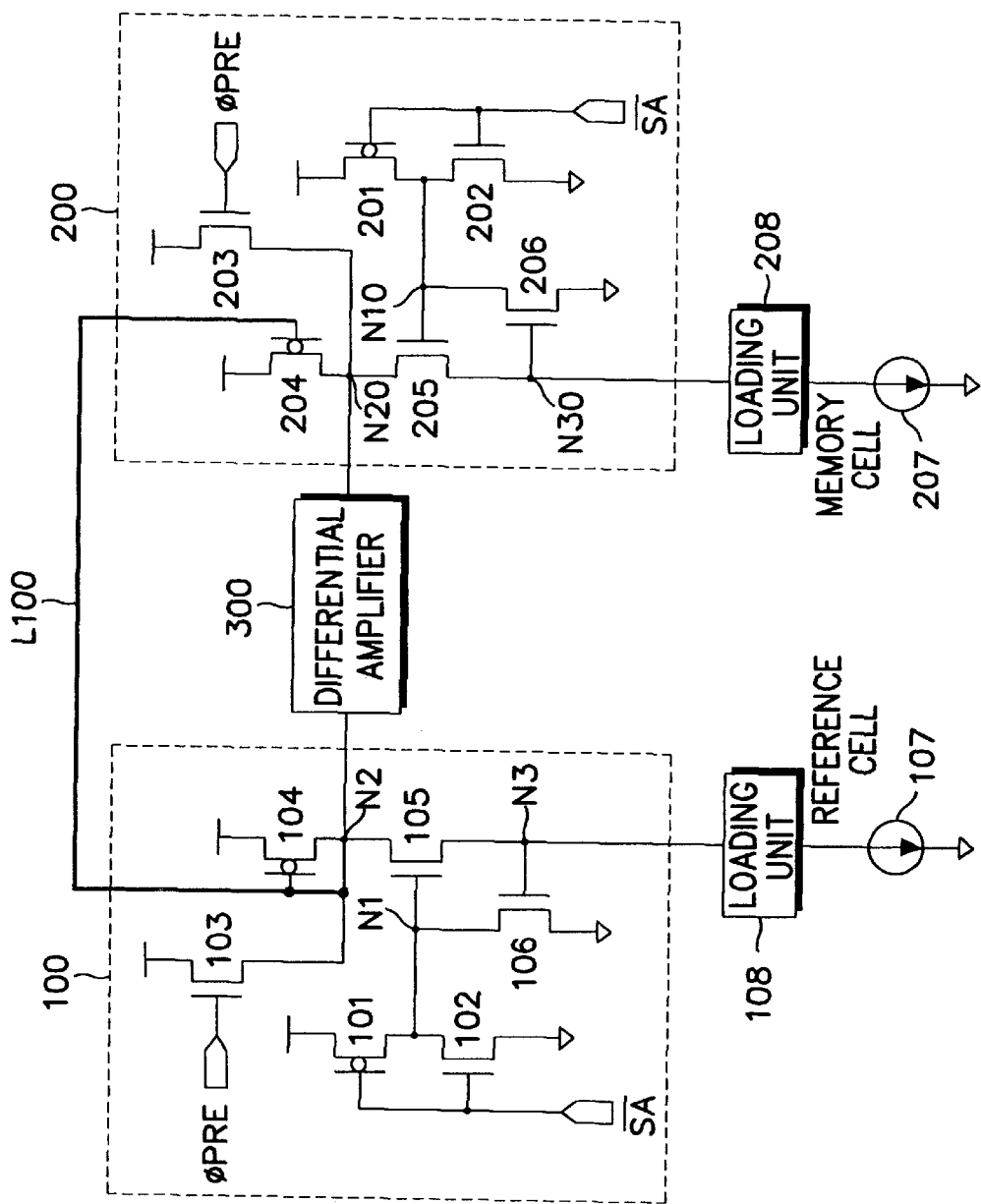
FIG. 3 is a schematic diagram of a first embodiment of a sense amplifier in accordance with the present invention.

A first embodiment of a sense amplifier in accordance with the present invention is illustrated in FIG. 3. The sense amplifier in FIG. 3 senses the voltage difference between a sense signal which is determined by the cell current flowing through a memory cell and a reference signal which is determined by a reference current. Normally, the reference current is set to about one half the cell current which flows through a cell that is in the ON state. However, it should be noted that a cell current which is two or more times larger then the reference current may be used.

Figure 1:
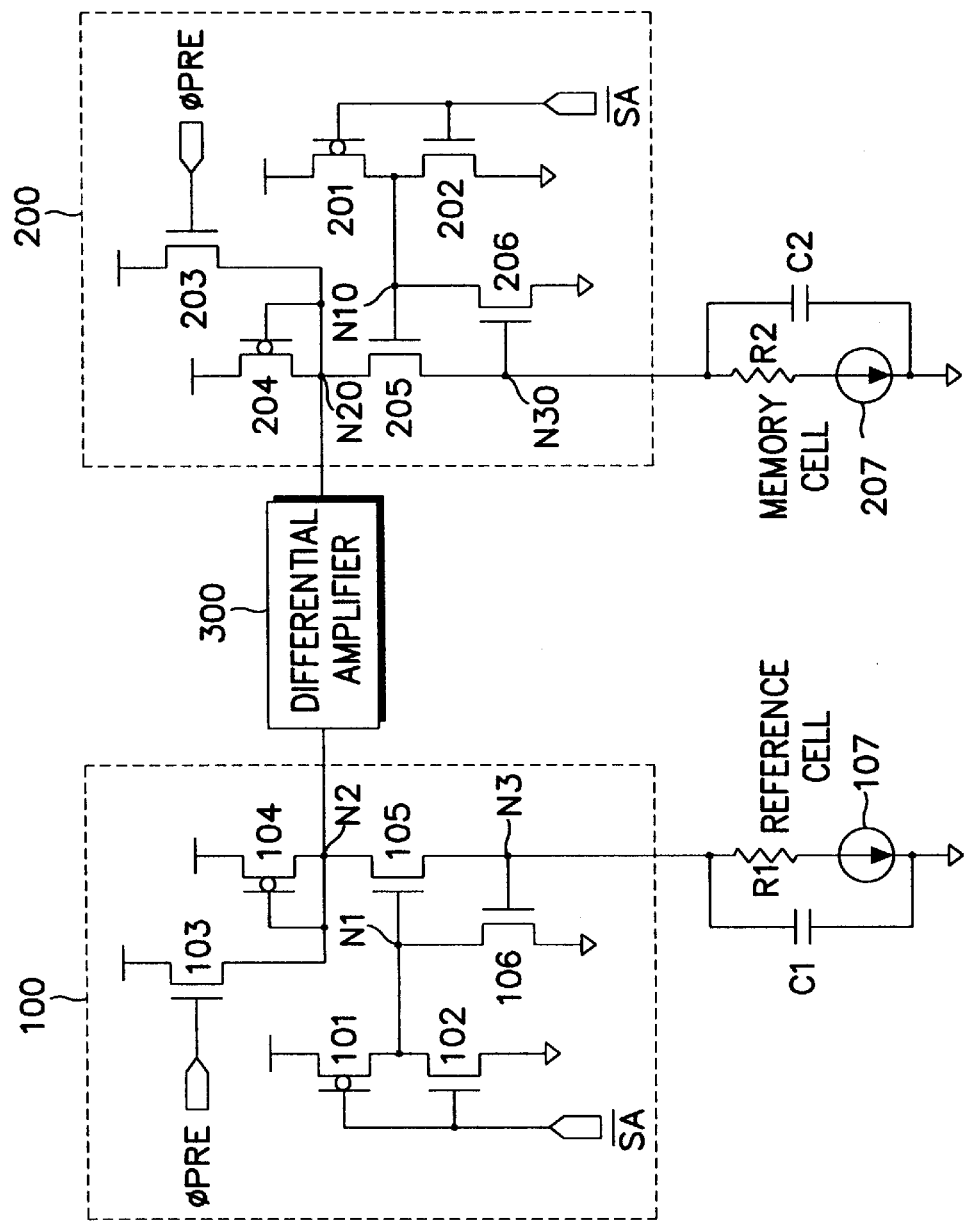
FIG. 1 is a schematic diagram of a prior art sense amplifier.
Figure 2:
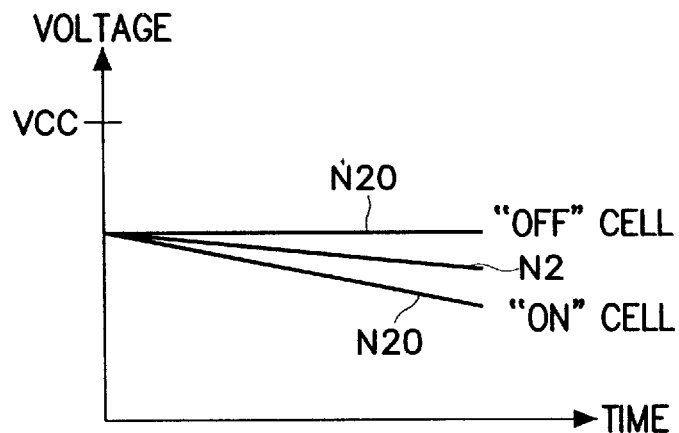
FIG. 2 is a waveform diagram showing the voltages of signals generated by the sense amplifier of FIG. 1.

The sense amplifier of FIG. 3 has many common elements with the prior art sense amplifier of FIG. 1, so the elements in the circuit of FIG. 3 which correspond to elements in the circuit of FIG. 1 are designated by the same reference numerals. The loading unit 108 provides the same function as the capacitor C1, resistor R1 and reference current supply source 107 of FIG. 1. Similarly, the loading unit 208 provides the same function as the capacitor C2, resistor R2 and memory cell current supply source 207 of FIG. 1. An important difference between the circuit of FIG. 3 and the prior art circuit of FIG. 1 is that the gate of the current supply PMOS transistor 204 in the circuit of FIG. 3 is not connected to the sense node of N20, but instead, is connected to the gate of PMOS current supply transistor 104 through a line L100. Thus, the gates of transistors 104 and 204 are controlled by a common control signal which is generated at reference node N2. In this configuration, transistors 104 and 204 function as a current mirror, i.e., they supply the same current or a proportional current.

In operation, when the sense amplifier of FIG. 3 reads the state of a memory cell which is in the OFF state, the memory cell does not discharge any current from the sense node N20 because the current path is cut off by NMOS transistor 205. However, PMOS transistor 204 continuously supplies the same amount of current to the sense node N20 as the PMOS transistor 104 supplies to the reference node N2. Accordingly, the voltage of the sense signal generated at sense node N20 rises rapidly. On the other hand, the voltage of the reference signal which is generated at the reference signal which is generated at reference node N2 varies in the same manner as in the prior art circuit of FIG. 1 because reference current supply source 107 discharges current from node N2 when transistor 105 turns on.

Figure 4:
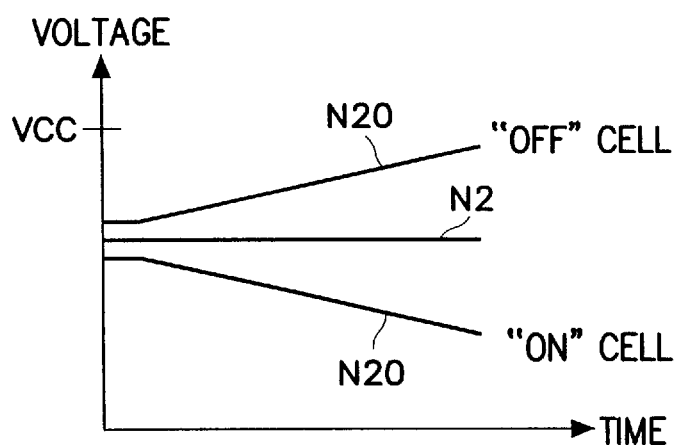
FIG. 4 is a waveform diagram showing the voltages of signals generated by the sense amplifier of FIG. 3.

As a result, the voltage at the sense node N20 is allowed to vary widely with respect to the voltage at the reference node N2 as is illustrated in FIG. 4.

When the sense amplifier of FIG. 3 reads the state of a memory cell which is in the ON state, the memory cell current supply source 207 discharges current from sense node N20, and the voltage of the sense signal decreases rapidly. Once again, however, the increase in the voltage of the reference signal at N2 is limited in the same manner as in the prior art circuit of FIG. 1. Thus, the voltage difference between the reference signal and the sense signal increases as shown in FIG. 4.

Figure 5:
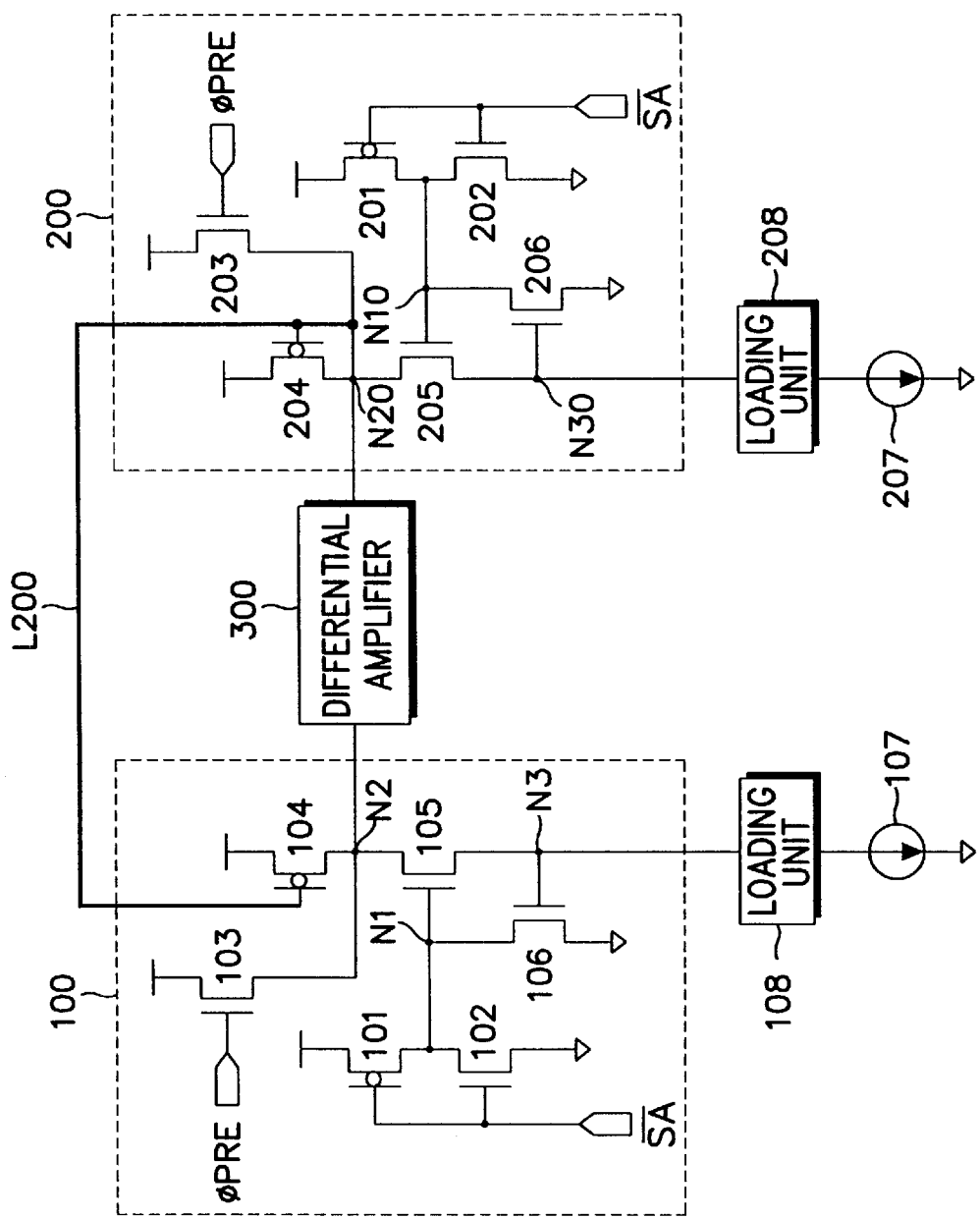
FIG. 5 is a schematic diagram of a second embodiment of a sense amplifier in accordance with the present invention.

A second embodiment of a sense amplifier in accordance with the present invention is illustrated in FIG. 5. The sense amplifier of FIG. 5 has a similar configuration to that of FIG. 3, and elements corresponding to those of FIG. 3 are denoted by the same reference designators. An important difference between the circuit of FIG. 5 and the circuit of FIG. 3 is that the gate of the current supply PMOS transistor 104 in the reference signal generator 100 of FIG. 5 is not connected to the reference node N2, but instead, is connected to the gate of current supply PMOS transistor 204. The gate of transistor 204 is connected to the sense node N20. Thus, transistors 104 and 204 of FIG. 5 are coupled to form a current mirror that is controlled by a common control signal which is generated at the sense node N20.

In operation, when the sense amplifier of FIG. 5 senses the state of a memory cell which is in the OFF state, the memory cell does not discharge any current from the sense node N20 because the current path is cut off by NMOS transistor 205. Accordingly, the voltage of the sense signal at node N20 rises rapidly as in the case of the prior art circuit of FIG. 1.

Figure 6:
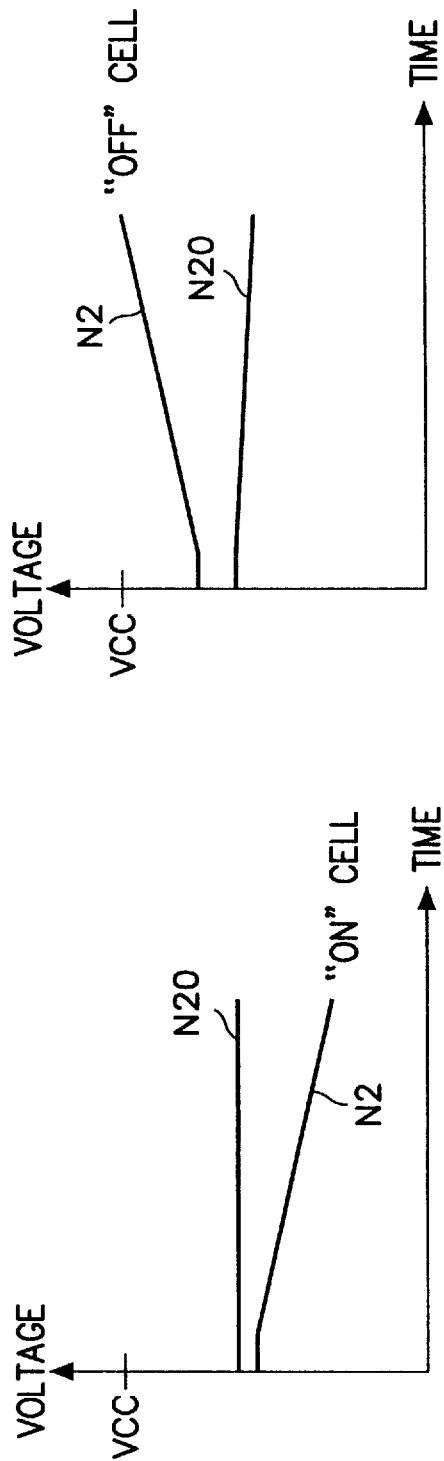
FIG. 6 is a waveform diagram showing the voltages of signals generated by the sense amplifier of FIG. 5.

However, the voltage of the reference signal generated at reference node N2 decreases rapidly, and the decrease in voltage is not limited as in the case of the prior art circuit of FIG. 1 because the gate of current supply transistor 104 is controlled by the common control signal which is generated at sense node N20 and also controls the gate of transistor 204. As a result, the voltage of the reference signal at the reference node N2 is allowed to vary widely with respect to voltage of the sense signal at N20 as shown in FIG. 6.

When the sense amplifier of FIG. 5 reads the state of a memory cell which is in the ON state, the memory cell current supply source 207 discharges current that is supplied to the sense node N20 by current supply transistor 204. Accordingly, the voltage of the sense signal at node N20 decreases in the same manner as in the prior art circuit of FIG. 1.

However, the voltage of the reference signal at node N2 increases by a greater amount then in the case of the prior art circuit of FIG. 1 because the current from the current supply transistor 104 is only discharged by the reference cell current supply source 107 and is not limited by any feedback action at transistor 104. Thus, the voltage of the reference signal at node N2 varies widely with respect to the voltage of the sense signal at node N20 as shown in FIG. 6.

Thus, by using current supply transistors 102 and 104 which are coupled to form a current mirror in which the gate of at least one of the transistors is decoupled from its drain, a sense amplifier in accordance with the present invention exhibits an increased sense speed and sensitivity by increasing the voltage difference between the reference signal and the sense signal when reading the state of a memory cell.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A sense amplifier comprising:

a first current source for generating a reference signal;

a second current source coupled to a sense line at a sense node for generating a sense signal responsive to the state of a memory cell; and a differential amplifier coupled to the first and second current sources for amplifying the difference between the sense signal and the reference signal;

wherein the first current source and the second current source are controlled by a common control signal on a common line coupled to the first current source, the second current source, and the sense node.

2. A sense amplifier according to claim 1 wherein:

the first current source is a first transistor;

the second current source is a second transistor; and the first and second transistors are coupled to form a current mirror.

3. A sense amplifier according to claim 2 wherein:

the first transistor includes a controlled current path coupled between a power supply terminal and a first node, and a control terminal coupled to receive the common control signal;

the second transistor includes a controlled current path coupled between the power supply terminal and a second node, and a control terminal coupled to the control terminal of the first transistor; and the differential amplifier includes a first input terminal coupled to the first node, and a second input terminal coupled to the second node.

4. A sense amplifier according to claim 3 wherein the control terminal of the second transistor is coupled to the second node.

5. A sense amplifier according to claim 4 wherein the common control signal is generated at the second node.

6. A sense amplifier according to claim 1 further including a reference cell coupled to the first current source.

7. A sense amplifier according to claim 3 further including:

a first precharge transistor having a controlled current path coupled between the power supply terminal and the first node and a control terminal coupled to receive a precharge signal; and a second precharge transistor having a controlled current path coupled between the power supply terminal and the second node and a control terminal coupled to receive the precharge signal.

8. A sense amplifier according to claim 3 further including a third transistor having a controlled current path coupled between the second node and the memory cell.

9. A sense amplifier according to claim 8 further including a fourth transistor having a controlled current path coupled between a gate of the third transistor and a second power supply terminal and a gate coupled to the memory cell.

10. A sense amplifier according to claim 9 further including an invertor having an output terminal coupled to the gate of the third transistor and an input terminal coupled to receive a sense amplifier control signal.

11. A sense amplifier according to claim 3 further including:
- a third transistor having a controlled current path coupled between the first node and a reference cell;
- a fourth transistor having a controlled current path coupled between a gate of the third transistor and a second power supply terminal and a gate coupled to the reference cell; and
- an invertor having an output terminal coupled to the gate of the third transistor and an input terminal coupled to receive a sense amplifier control signal.

12. A sense amplifier comprising:
- means for generating a reference signal;
- means for generating a sense signal responsive to the state of a memory cell; and
- a differential amplifier for amplifying the difference between the reference signal and the sense signal;
- wherein the means for generating a reference signal includes a first transistor, the means for generating a sense signal includes a second transistor, and the first and second transistors are coupled to form a current mirror having a common control line coupled to an input terminal of the differential amplifier.

13. A sense amplifier according to claim 12 wherein the first transistor includes a controlled current path and a control terminal coupled to the controlled current path.

14. A sense amplifier according to claim 12 wherein the second transistor includes a controlled current path and a control terminal coupled to the controlled current path.

15. A method for sensing the state of a memory cell comprising:
- generating a first current;
- discharging the first current, thereby generating a reference signal;
- generating a second current;
- discharging the second current responsive to the state of the memory cell, thereby generating a sense signal;
- amplifying the difference between the reference signal and the sense signal; and
- controlling the first and second currents responsive to a common control signal;
- wherein the sense signal functions as the common control signal.

16. A method according to claim 15 wherein generating the second current includes mirroring the first current.

17. A method according to claim 15 wherein generating the first current includes mirroring the second current.

18. A method according to claim 15 wherein discharging the first current includes discharging the first current responsive to the state of a reference cell.

19. A sense amplifier comprising:
- a first current source for generating a reference signal at a reference node;
- a second current source coupled to a sense line for generating a sense signal responsive to the state of a memory cell; and
- a differential amplifier coupled to the first and second current sources for amplifying the difference between the sense signal and the reference signal;
- wherein the first current source and the second current source are controlled by a common control signal on a common line coupled to the first current source, the second current source, and the reference node.

20. A sense amplifier comprising:
- a first current source coupled to a first node for generating a first signal responsive to current flowing through a first cell;
- a second current source coupled to a second node for generating a second signal responsive to current flowing through a second cell;
- a differential amplifier coupled to the first and second nodes for amplifying the difference between the first signal and the second signal; and
- a common control line coupled between the first and second current sources and to the first node.

21. A sense amplifier according to claim 20 wherein:
- the first node is a reference node, the first signal is a reference signal, and the first cell is a reference cell; and
- the second node is a sense node, the second signal is a sense signal, and the second cell is a memory cell.

22. A sense amplifier according to claim 20 wherein:
- the first node is a sense node, the first signal is a sense signal, and the first cell is a memory cell; and
- the second node is a reference node, the second signal is a reference signal, and the second cell is a reference cell.

23. A method for sensing the state of a memory cell comprising:
- generating a first current;
- discharging the first current, thereby generating a reference signal;
- generating a second current;
- discharging the second current responsive to the state of the memory cell, thereby generating a sense signal;
- amplifying the difference between the reference signal and the sense signal; and
- controlling the first and second currents responsive to a common control signal;
- wherein the reference signal functions as the common control signal.

* * * * *